United States Patent [19]
Clausen, Jr. et al.

[11] Patent Number: 5,104,824
[45] Date of Patent: Apr. 14, 1992

[54] SELECTIVE AREA REGROWTH FOR SURFACE-EMITTING LASERS AND OTHER SHARP FEATURES

[75] Inventors: Edward M. Clausen, Jr., Eatontown; Etienne G. Colas, Red Bank; Ann C. Von Lehmen, Little Silver, all of N.J.

[73] Assignee: Bell Communications Research, Inc., Livingston, N.J.

[21] Appl. No.: 609,920

[22] Filed: Nov. 6, 1990

[51] Int. Cl.$^5$ .................. H01L 21/20; H01L 21/203
[52] U.S. Cl. ....................................... 437/90; 437/126; 437/129; 148/DIG. 95; 148/DIG. 26; 148/DIG. 50
[58] Field of Search ............... 437/126, 129, 962, 90, 437/937, 946; 148/DIG. 26, DIG. 50, DIG. 103, DIG. 105, DIG. 95

[56] References Cited

U.S. PATENT DOCUMENTS

| | | | |
|---|---|---|---|
| 4,426,767 | 1/1984 | Swanson et al. | 437/90 |
| 4,637,129 | 1/1987 | Derkits, Jr. et al. | 148/DIG. 26 |
| 4,868,633 | 9/1989 | Plumton et al. | 357/34 |
| 4,888,085 | 12/1989 | Smith | 437/129 |
| 4,939,104 | 7/1990 | Pollack et al. | 437/52 |
| 4,949,350 | 8/1990 | Jewell et al. | 372/45 |

FOREIGN PATENT DOCUMENTS

| | | | |
|---|---|---|---|
| 192322 | 9/1985 | Japan | 437/90 |
| 89324 | 4/1987 | Japan | 437/90 |

OTHER PUBLICATIONS

H. E. G. Arnot et al., "Photoluminescence Studies of overgrown GaAs/AlGaAs MOCVD and MBE Quantum Dots," Quantum Well for Optics and Optoelectronics, 1989 Technical Digest Series, 1989, vol. 10, pp. 83–87.

A. Izrael et al., "Microfabrication and Optical Study of Reactive Ion Ethced InGaAsP/InP and GaAs/GaAlAs Quantum Wires," *Applied Physics Letters*, 1990, vol. 56, pp. 830–832.

J. A. Lebens, "Application of Selective Epitaxy to Fabrication of Nanometer Scale Wire and Dot Structures," *Applied Physics Letters*, 1990, vol. 56, pp. 2642–2644.

E. Tokumitsu et al., "Molecular Beam Epitaxial Growth of GaAs Using Trimethylgallium as a Ga Source," *Journal of Applied Physics*, 1984, vol. 55, pp. 3163–3165.

J. P. Harbison et al., "Tungsten Patterning as a Technique for Selective Area III-V MBE Growth," *Journal of Vacuum Science and Technology B*, 1985, vol. 3, pp. 743–745.

E. Corcoran, "Diminishing Dimensions," *Scientific American*, 1990 Nov., pp. 122–131.

*Primary Examiner*—Brian E. Hearn
*Assistant Examiner*—Linda J. Fleck
*Attorney, Agent, or Firm*—Leonard Charles Suchyta; Charles S. Guenzer

[57] ABSTRACT

A method of etching and regrowing III-V compounds in a sharply defined vertical feature. Molecular beam epitaxy is used to grow a laterally undefined vertical-cavity, surface-emitting diode laser structure from semiconducting III-V materials. The structure includes interference mirrors defining the end of a Fabry-Perot cavity and a quantum-well layer in the middle of the cavity. A tungsten mask is then defined over the areas of the intended two-dimensional array of lasers. A chemically assisted ion beam etches through to the bottom of the laser structure to from an array of high aspect-ratio pillars. A thermal chlorine gas etch removes a portion of the sidewalls of the pillars without attacking the tungsten, thereby removing ion-beam damage at the sides of the vertical-cavities and creating a lip of the tungsten mask overhanging the pillar sidewall. Organo-metallic chemical vapor deposition is used to regrow III-V material around the pillars. This growth process can quickly planarize the pillars. The tungsten lip prevents the growth from climbing over the top of the pillar. The regrown material may be insulating, or may include conductive portions ot provide laser contact, or may be selected to provide tailored index guiding in the laser device.

20 Claims, 5 Drawing Sheets

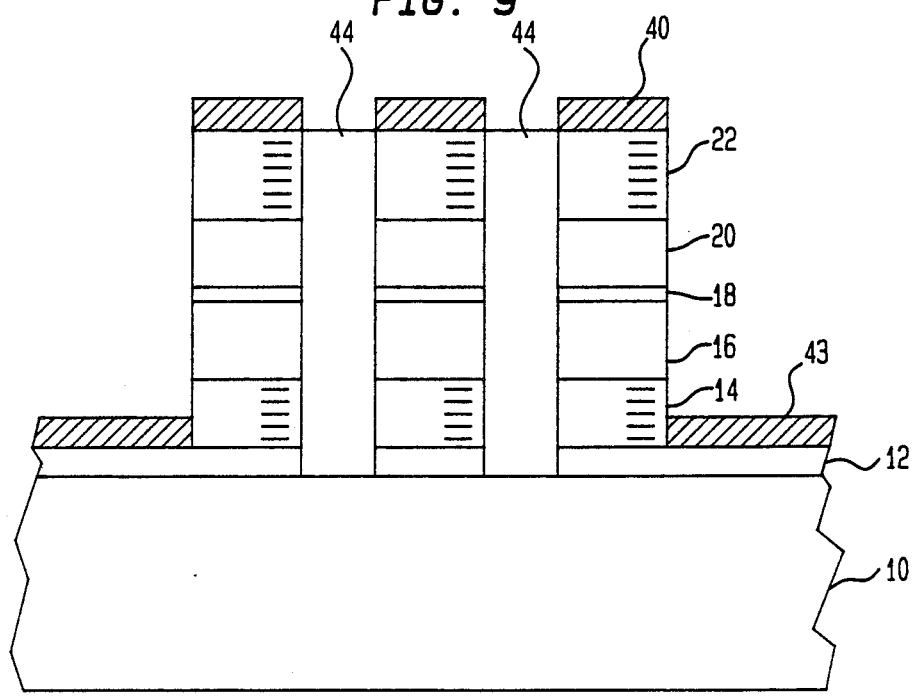
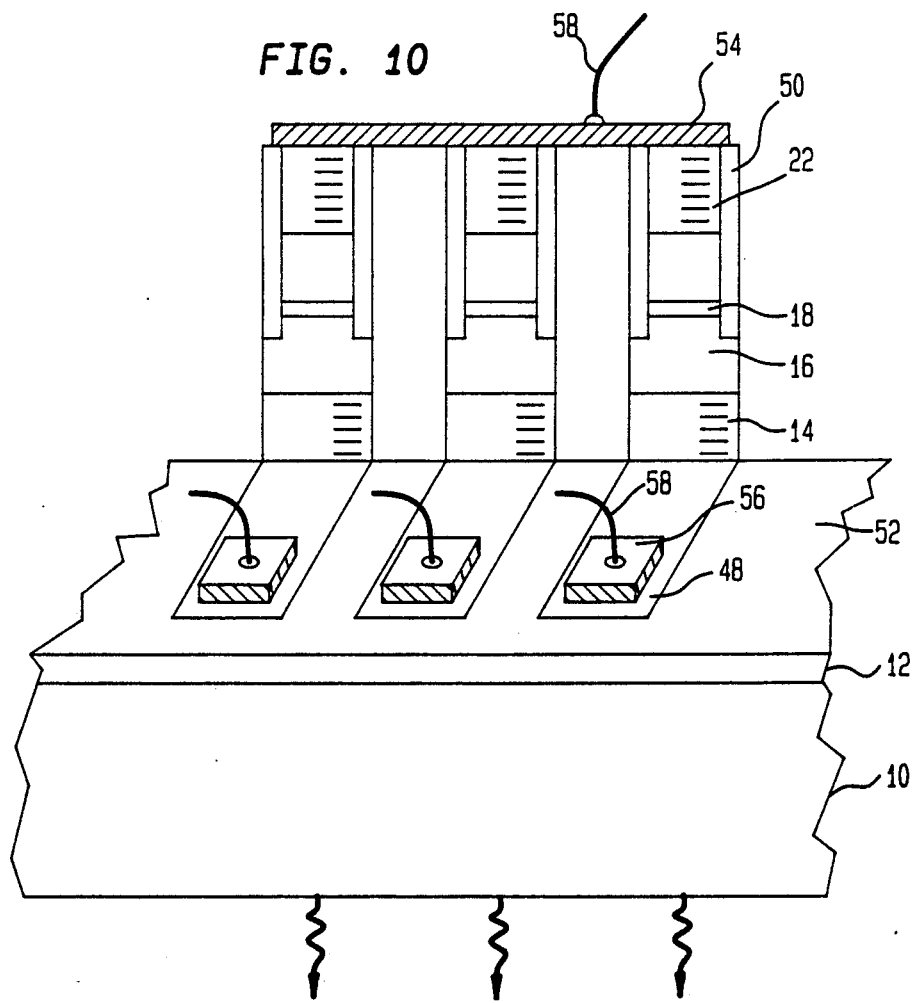

SELECTIVE AREA REGROWTH FOR SURFACE-EMITTING LASERS AND OTHER SHARP FEATURES

FIELD OF THE INVENTION

The invention relates generally to semiconductor processing; in particular, it relates to semiconductor regrowth adjacent to a sharp step in the semiconductor body.

BACKGROUND ART

Vertical-cavity, surface-emitting semiconductor lasers have been an object of research for many years. They offer high packing density, and batch processing of them on a wafer scale can lead to significant cost reductions for laser fabrication. Their very small optical cavities offer a level of low-power operation that was achieved with edge-emitting lasers only after years of research. The research on vertical-cavity, surface-emitting lasers intensified with the fabrication, as disclosed by Jewell et al. in U.S. Pat. No. 4,949,350, of a working array of such lasers having threshold currents in the milliamp range. In summary, they grew a laterally unpatterned vertical optical-cavity structure of two semiconductor interference mirrors separated by the lasing wavelength. The growth also formed midway between the mirrors an active quantum-well region that emitted at this wavelength. They then defined the individual lasers in the array by ion-beam etching through the entire vertical structures so as to form free-standing pillars. Each pillar constituted a separate laser. It had a height of 5.5 μm and a diameter in the range of micrometers. The lasers were individually contacted on their tops while a conducting semiconductor substrate served as a common counter-electrode. Laser light was emitted through the substrate.

It was early recognized that the free standing, high aspect-ratio pillars created difficulties for practical laser arrays. Making electrical contact to the top of a 1 μm pillar extending 5.5 μm above the substrate cannot be done with normal semiconductor processing techniques. Jewell et al. suggested surrounding the pillar with a low-index material, such as a polyimide. Recent work by others have pursued this polyimide planarization, but the results have not been completely satisfactory. The polymeric polyimide cannot be completely cured at the thickness required for tall pillars. The soft planarizing polyimide serves as a support for after deposited metallizations and causes difficulty for the spot welding of contact wires to the metallizations since the excessive heat causes the polymer to melt and flow.

Many researchers, including Jewell et al., have suggested regrowing III-V materials around the pillars. To date, the regrown structures have suffered various disadvantages. Arnot et al. have described regrowth around quantum-dot pillars in "Photoluminescence Studies of overgrown GaAs/AlGaAs MOCVD and MBE Quantum Dots," *Quantum Well for Optics and Optoelectronics*, 1989 Technical Digest Series, volume 10, conference edition, pages 83–87. Their pillars contained multiple quantum wells, which were defined by a polymeric mask which was removed before regrowth. They measured the luminescence before and after regrowth. Their results showed degradation in the luminescence after regrowth for the smaller pillars, whether the regrowth was by molecular beam epitaxy (MBE) or organo-metallic chemical vapor deposition (OMCVD). However, planarization was achieved. Izrael et al. have described similar experiments in "Microfabrication andoptical study of reactive ion etched InGaAsP/InP and GaAs/GaAlAs quantum wires," *Applied Physics Letters*, volume 56, 1990, pages 830–832. Their quantum wire structures were defined by reactive ion etching (RIE) using overlying aluminum or nickel masks. The metallic masks were removed after etching and prior to regrowth by OMCVD. The regrowth significantly reduced edge recombination; however, they did not attempt to planarize. Planarization of the structure was not achieved. The disparity in degradation between these two results may be caused by both of the structures being exposed to ambient air between the etching and the regrowth.

Lebens et al. have disclosed the fabrication of quantum-dot structures by selective area growth in "Application of selective epitaxy to fabrication of nanometer scale wire and dot structures," *Applied Physics Letters*, volume 56, 1990, pages 2642–2644. The dot pattern was etched into a $Si_3N_4$ mask overlying an AlGaAs substrate. Thereafter, a 100 nm thick GaAs layer was grown by OMCVD. However, the GaAs selectively grew only in the opening of the $Si_3N_4$ mask, thereby forming quantum dots.

Tokumitsu et al. disclose a similar process with organo-metallic molecular beam epitaxy (OMMBE) in "Molecular beam epitaxial growth of GaAs using trimethylgallium as a Ga source," *Journal of Applied Physics*, volume 55, 1984, pages 3163–3165. OMMBE uses MBE for some of its components but uses OMCVD for others. Thus, it ultimately relies on chemical vapor deposition (CVD) and the concomitant chemical reaction at the growing surface. Tokumitsu et al. used $SiO_x$ as the masking layer. After regrowth in the openings of the $SiO_x$ mask, the mask was lifted off.

The use of low molecular-weight $SiO_x$ and $Si_3N_4$ masks is disadvantageous for fabricating the vertical-cavity, surface-emitting lasers for which ion-beam etching is required to form the high aspect-ratio vertical features.

In contrast to OMCVD and OMMBE, MBE is a purely ballistic process of co-depositing multiple species from respective sources. Therefore, MBE is much less sensitive to selective growth than OMCVD. Harbison et al. disclose an attempt to extend selective area regrowth to MBE in "Tungsten patterning as a technique for selective area III-V MBE growth," *Journal of Vacuum Science and Technology* B, volume 3, 1985, pages 743–745. They patterned a metallic mask on a GaAs substrate, similarly to Lebens et al., but the mask was composed of tungsten. Then they grew a GaAs layer. The GaAs grew epitaxially in the opening of the mask but grew as a polycrystallite above the tungsten. The tungsten was then lifted off, thus removing the polycrystalline GaAs. Harbison et al. noted that a fluorine plasma etch removes the tungsten while leaving the III-V material but a chlorine etch removes the III-V material while leaving the tungsten. MBE regrowth is more limited for pillars because of the directionality and non-selectivity of the growth. That is, it is difficult to obtain uniform growth on the sidewalls of high aspect-ratio (tall) structures. Furthermore, although MBE provides exceedingly fine thickness control, it is a very slow growth process.

SUMMARY OF THE INVENTION

Accordingly, an object of the invention is to provide for selective regrowth around a free-standing pillar or mesa.

A further object is to provide for planarization by the regrowth.

A yet further object is to allow easy contacting to the top of the pillar or mesa after planarization.

The invention can be summarized as a method of regrowth of epitaxial compound semiconductor material around a deeply etched semiconductor feature. A refractive metal, e.g., tungsten mask is patterned for the feature, and the feature is ion etched around the mask. A directional etch, preferably a chlorine-assisted ion-beam etch, removes a portion of the side of the feature. Then, semiconductor material is deposited by chemical vapor deposition. The growth process provides for regrowth on the exposed semiconductor. However, the tungsten rejects any growth. Thereby, the semiconductor material is selectively regrown. Furthermore, the chlorine plasma etch does not attack the tungsten so as to undercut it. Thereby, the upward migration of the semiconductor material on the vertical face of the feature is stopped by the overhanging lip of the mask.

BRIEF DESCRIPTION OF THE DRAWINGS

FIGS. 7 through 10 are cross-sectional views (FIG. 10 being partly in perspective) illustrating steps in fabricating another embodiment of the invention.

DETAILED DESCRIPTION OF THE PREFERRED EMBODIMENTS

The invention relies upon the use of tungsten masks for selective area regrowth by chemical vapor deposition of the semiconductor material. An embodiment of the invention will be disclosed with reference to the pillar-like, vertical-cavity, surface-emitting lasers of Jewell et al.

Figure 1:
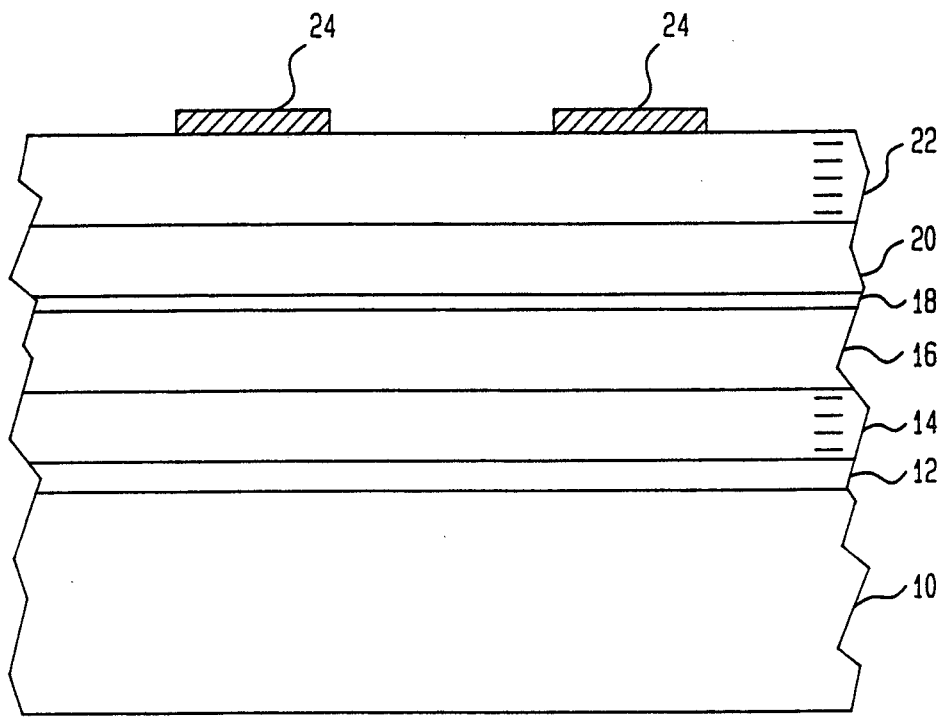
FIGS. 1 through 4 are cross-sectional views illustrating steps in fabricating an array of vertical-cavity, surface-emitting lasers according to one embodiment of the invention.

Following the procedure of Jewell et al., molecular beam epitaxy (MBE) is used to grow a laterally undefined structure for a vertical-cavity, surface-emitting diode laser. As illustrated in cross-section in FIG. 1, a substrate 10 is composed of semi-insulating GaAs. An n+ contact layer 12 of GaAs is deposited on the substrate 10. Use of the n+ contact layer 12 with an insulating substrate 10 differs from Jewell et al. but is disclosed by Orenstein et al. in U.S. Pat. No. 5,031,187. An n+ lower dielectric mirror 14 is deposited on the contact layer 12. It consists of approximately twenty periods of alternating quarter-wavelength layers of AlAs and GaAs with intermediate superlattices, all disclosed by Jewell et al. An n+ lower spacer 16 of $Al_{0.5}Ga_{0.5}As$ is deposited on the lower mirror 14. On the lower spacer 16 is deposited an active region 18 consisting of at least one thin $In_{0.2}Ga_{0.8}As$ quantum-well layer and GaAs barrier layers sandwiching each quantum-well layer. The composition and thickness of the quantum-well layer are chosen so that it emits light at a wavelength $\lambda=958$ nm. A p+ upper spacer 20 of $Al_{0.5}Ga_{0.5}As$ is deposited on the active region. An p+ upper dielectric mirror 22, similar to the lower mirror 14 is deposited on the upper spacer 20. The thickness of the spacers 16 and 20 and the phase of the mirror stacks 14 and 22 are chosen so that a resonant optical cavity is formed between the mirrors 14 and 22 for the emitting wavelength $\lambda$. That is, the optical distance (distance multiplied by the appropriate refractive index) between the mirrors 14 and 22 is a predetermined multiple of $\lambda/2$. The lowerst order is preferably used so that the maximum of the light intensity falls on the active region 18. The foregoing is all well known.

Photoresist is then spun on, optically exposed, and developed to leave openings above the intended pillars, for example, openings of 3 $\mu m$ diameter. Although only two pillars will be illustrated, the invention is applicable to a two-dimensional array of lasers. A masking layer of tungsten (W) is deposited over the patterned photoresist to a thickness of 0.2 $\mu m$ using magnetron sputtering. The photoresist is then removed so as to lift off the unwanted tungsten and leaving tungsten masking areas 24. In contrast, Jewell et al. used either nickel, chromium, or titanium for their masking material.

Figure 2:
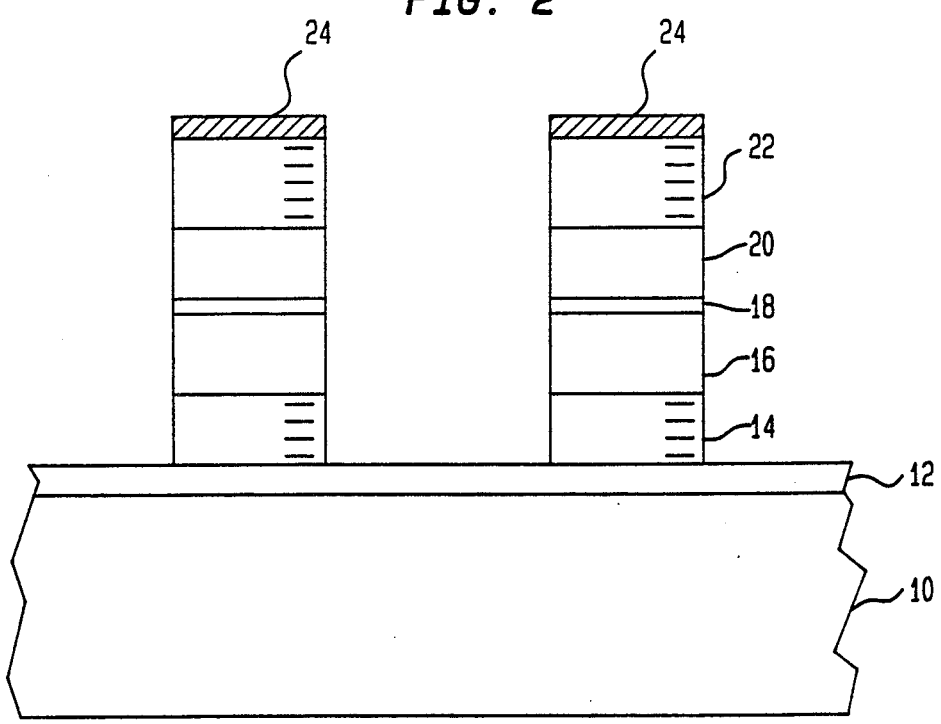

As illustrated in FIG. 2, the structure is then deeply etched by chemically assisted ion beam etching, for example, a 50 $\mu A/cm^2$ current of 1000 eV xenon ions in a chlorine ambient of $5 \times 10^{-4}$ torr. In the first embodiment, the etching stops before the n+ contact layer 12 so that it provides a common lower contact. The free standing pillars rise about 5 $\mu m$ above the contact layer 12.

Figure 3:
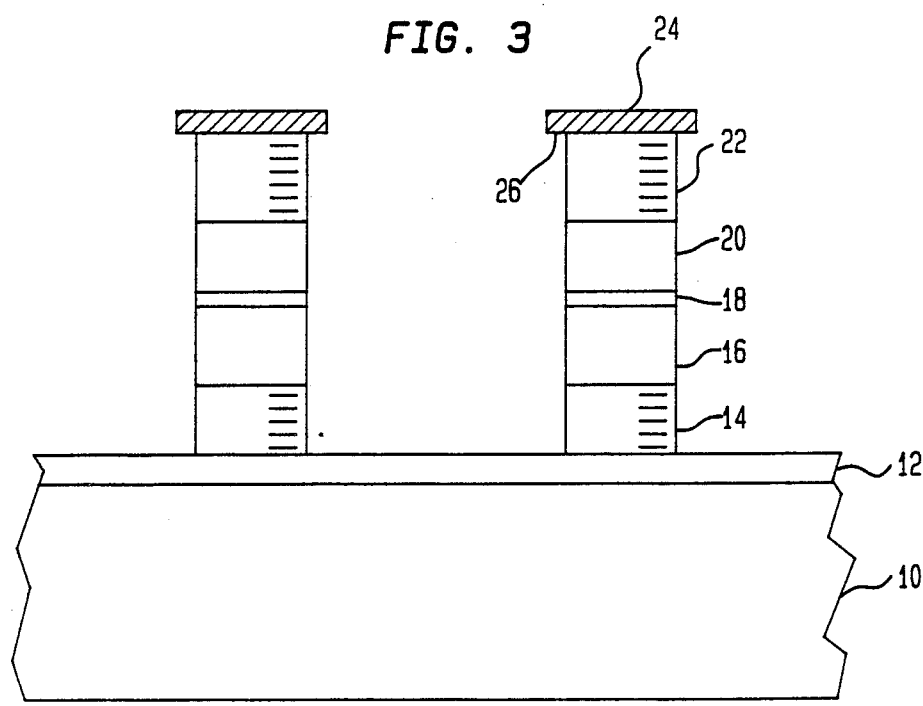

As illustrated in FIG. 3, thermal chlorine etching reduces the size of the pillars. One purpose of the etching is to remove the ion beam damage at the sides of the pillars. Etching for one minute in a $Cl_2$ ambient of $5 \times 10^{-4}$ torr with the sample held at 250° C. removes about 500 nm of GaAs or AlGaAs so that the pillar diameter is reduced to 2 $\mu m$. However, the thermal $Cl_2$ etching does not attack the W mask 24, which is undercut to produce a lip 26 surrounding the top of the etched pillar.

To preserve access to the contact layer 12, a portion of it away from the lasers is masked with tungsten using the photoresist lift-off process described above.

The ion-beam etching and the chlorine etching are performed in the same chamber. Subsequent steps require removal of the sample from that chamber. Prior to removal, the sample is passivated by exposing it to arsenic at a pressure of $1 \times 10^{-6}$ torr and a substrate temperature of $-50°$ C.

Figure 4:
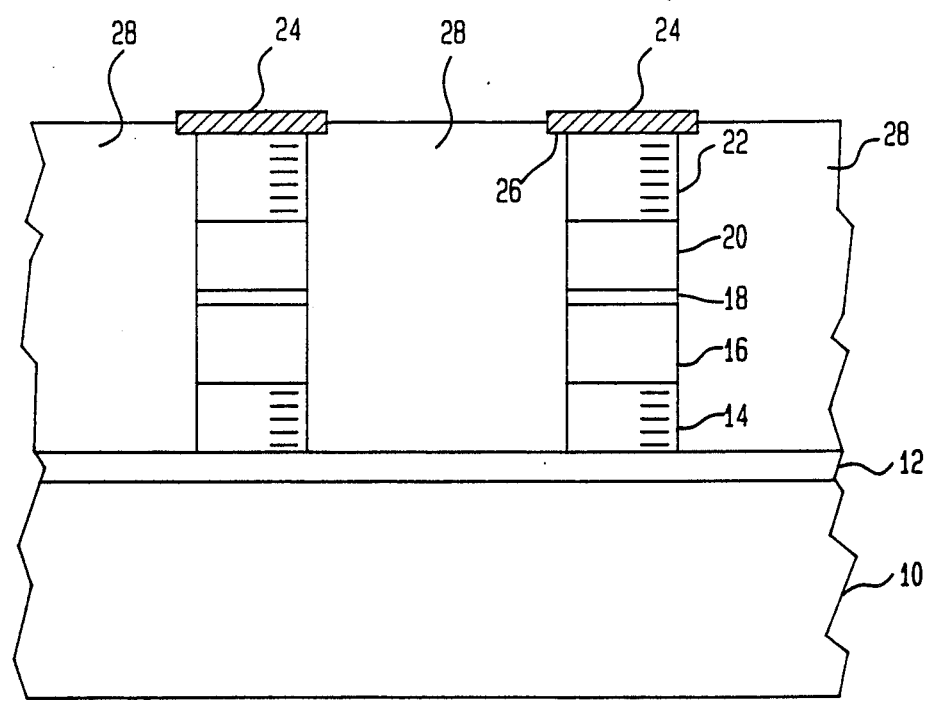

The sample is then transferred to an organo-metallic chemical vapor deposition (OMCVD) growth chamber. As illustrated in FIG. 4, a regrown region 28 is then formed by OMCVD to a depth approximately corresponding to the height of the pillar. The OMCVD is performed at low pressure, approximately 30 torr. The regrown region 28 consists of GaAs, AlGaAs, or other related alloys so as to form a defect-free epitaxial interface with the sides of the pillars. Because OMCVD is a vapor phase growth procedure, the growth is selective and does not form on top of the W masks 24. The lips 26 of the W masks 24 prevent the upward migration of the growth material along the sides of the pillars, which would otherwise produce a rim surrounding the masks 24. Thereby, the regrown region 28 can effectively planarize the pillar structure. Because the regrowth is performed by OMCVD, it proceeds much more quickly than by MBE.

The material of the regrown region 28 can be fairly freely chosen to satisfy various device designs. It may be deposited undoped so that it electrically insulates the lasers from each other. If the regrown region 28 is insulating, contact needs to be made to the top of the diode lasers. Although tungsten is conducting, it is preferred that a gold contact and reflector be used. The tungsten is removed by a $CF_4+O_2$ plasma, which does not attack the III-V materials of the laser or regrown region 28. The patterning of the subsequently deposited gold need not be very precise.

Control of the alloying percentage x in an $Al_{1-x}Ga_xAs$ regrown region 28 controls its refractive index n relative to the effective index of the pillar laser. Thereby, the amount of index guiding of light within the laser can be controlled.

Figure 5:
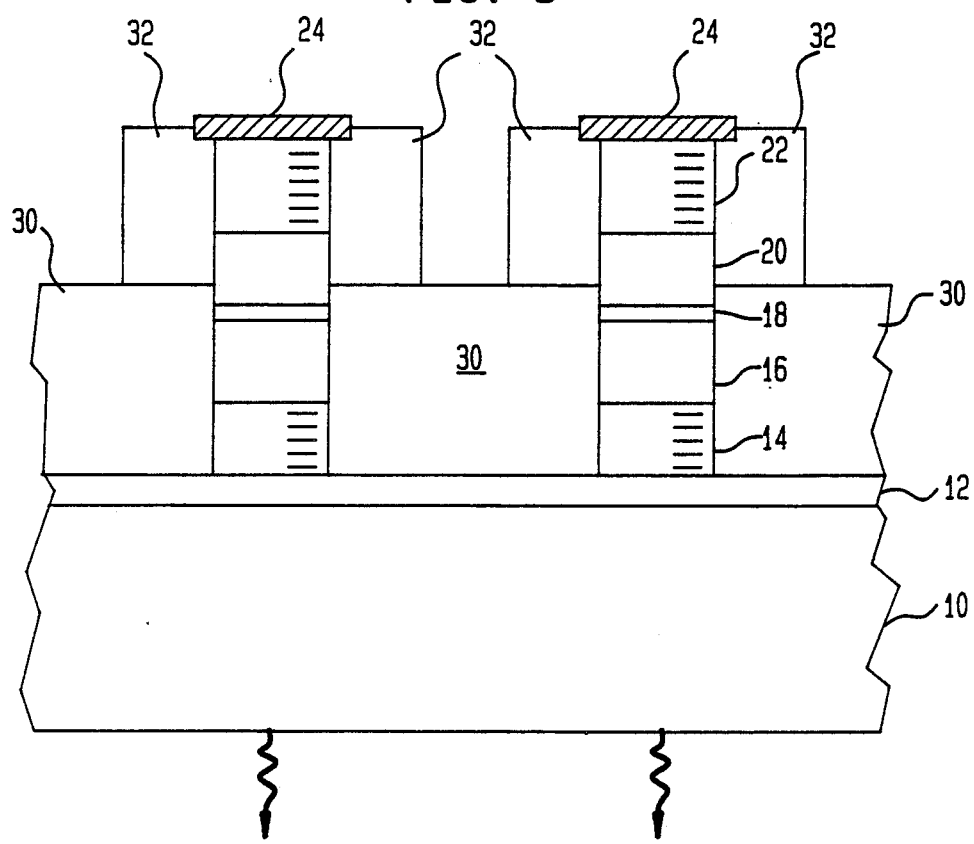
FIGS. 5 and 6 are cross-sectional views corresponding to FIG. 4 illustrating two additional embodiments of the invention.
Figure 6:
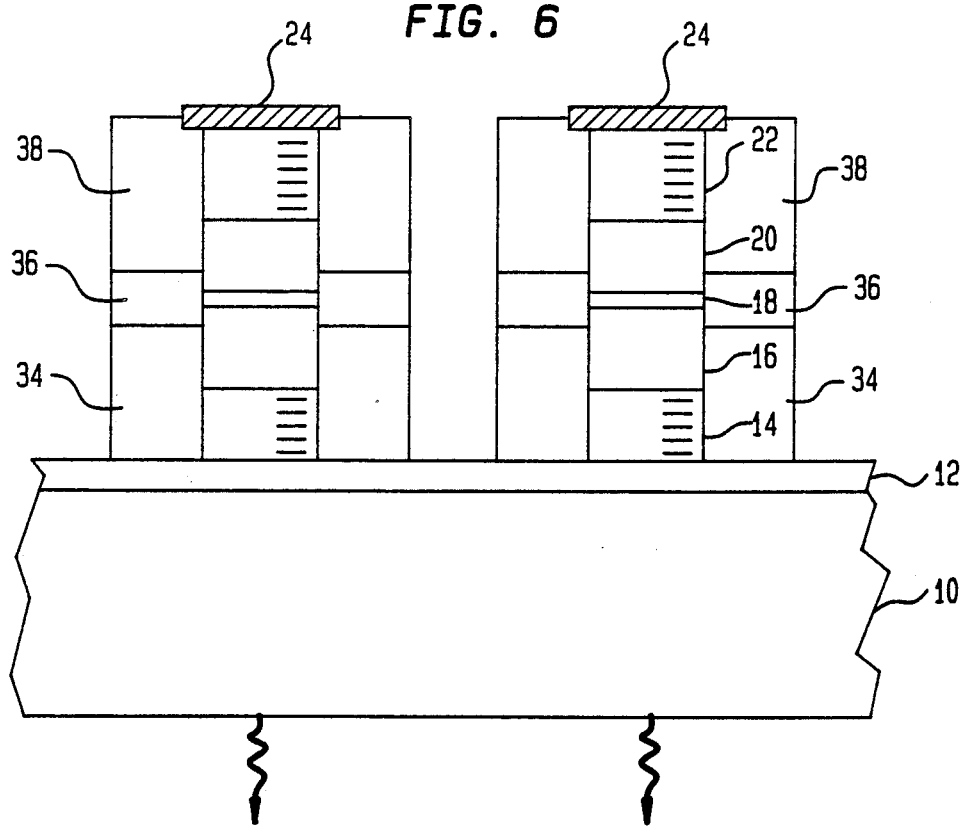

The composition of the regrown region 28 may be varied during its growth. For example, as illustrated in FIG. 5, a lower regrown region 30 is grown to just above the active region 18. The lower regrown region 30 is insulating. An upper regrown region 32 of $p^+Al_{0.5}Ga_{0.5}As$ is grown to the top of the pillar. By a separate masking and etching step, the upper regrown region 32 is etched back down to the lower regrown region 30 in order to provide electrical isolation between the lasers. The $p^+$ upper regrown region 32 provides a highly conducting, ohmic contact to the spacer 20 just above the active layer 18. Thereby, the resistance of the laser diode is decreased because current does not need to flow through the multi-junction upper mirror 22. This concept can be extended to the lower half of the laser, as illustrated in FIG. 6. An $n^+$ lower layer 34 is grown to just below the active region 18. An insulating layer 36 is grown adjacent to the active region 18. A $p^+$ upper layer 38 is then grown to the top. All three layers 34, 36, and 38 are etched through. Thereby, the current also avoids the lower mirror 14.

Figure 7:
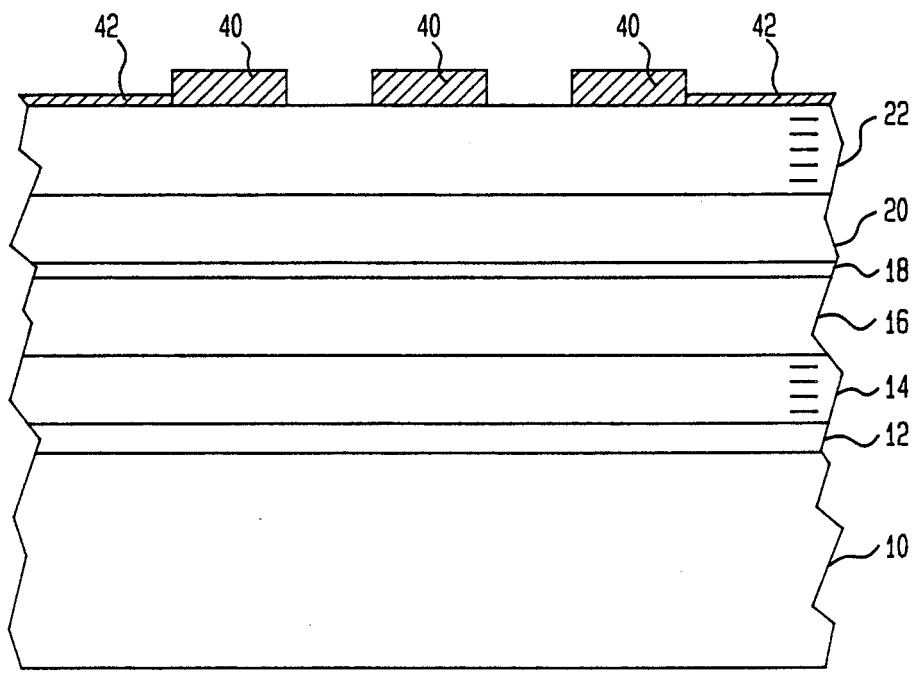
Figure 8:
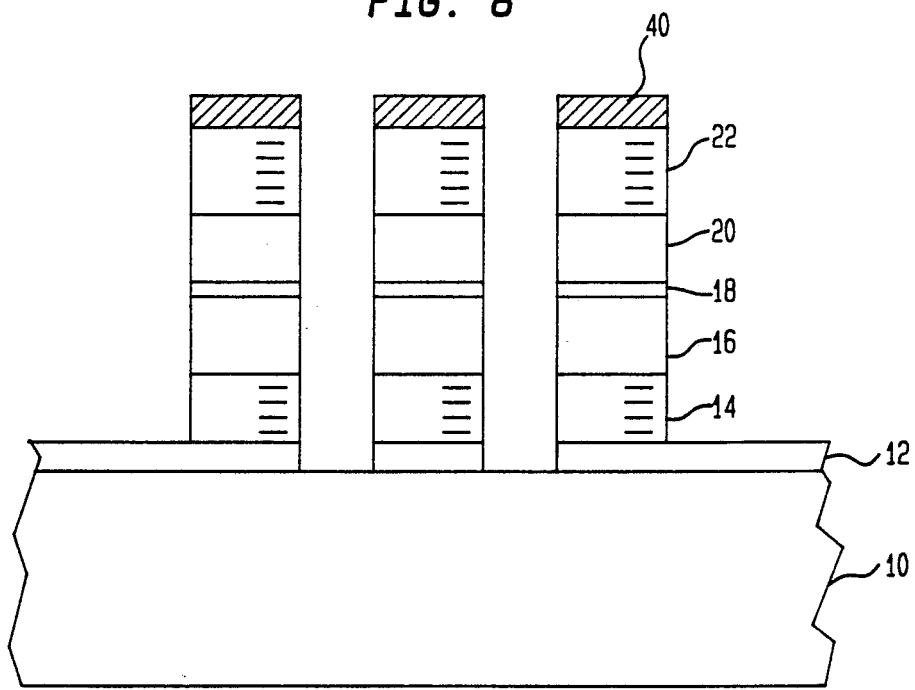

A matrix addressable 3×3 array of lasers of the invention will now be described. As illustrated in FIG. 7, after the growth of the vertical laser structure, three 300 nm tungsten ridge masks 40 are patterned in the area of the lasers by a first sequence of lithographic definition and lift-off. The ridge masks 40 run continuously from one side of the laser area to the other. In a second sequence of definition and lift-off, a 100 nm tungsten mask 42 is patterned to surround the laser area on all sides. Instead of lift-off, there may be substituted a second level lithography step with photoresist to pattern the tungsten with a freon+$O_2$ etch. The dual-height mask 40 and 42 provides for differential etching depth in a single step of ion beam etching. As illustrated in FIG. 8, the unmasked areas between the ridge masks are etched down to the insulating substrate 10 to form isolation trenches between rows of lasers. Beneath each row runs a common electrical lead formed from the $n^+$ contact layer 12. The ion beam etches the W masking material at a finite rate. Part way through the ion beam etch, the thin W mask 42 surrounding the laser area is etched through and the underlying III-V material begins to be etched. As a result, the surrounding area is etched down only to the $n^+$ contact layer 12.

Prior to the planarization, the exposed contact layer 12 surrounding the laser area is protected by covering it with a tungsten layer 43, illustrated in FIG. 9, defined by another sequence of photolithography and lift-off. Then OMCVD is used to deposit regrown regions 44 of semi-insulating GaAs material extending parallel to the laser rows. The regrowth selectively avoids the W areas 40 and 43.

In this embodiment, the laser are laterally defined by ion implantation, generally following the method disclosed in the Orenstein et al. patent. In a lithographic step followed by exposure to a freon+$O_2$ plasma, the tungsten layer 40 and 43 is defined into a mask overlying the nine intended lasers and the three intended $n^+$ contact leads 48, illustrated in FIG. 10. The remaining tungsten serves as an implanation mask for protons or other conductivity reducing ions. The ion implantation produces columnar insulating regions 50 surrounding each laser and extending down through the active region 18. The insulating regions 50 electrically isolate the upper electrodes of the three different lasers in a row. This ion implantation also produces a surface insulating region 52 isolating the $n^+$ leads 48. With a further freon+$O_2$ plasma, the remaining tungsten mask is removed. In one lithographic step, three ohmic Au/Zn(13%) p-side contacts and leads are formed over the columns of lasers. The Au/Zn ohmic contact replaces the Be contact layer of Jewell et al. In a second lithographic step, three ohmic Au/Ge n-side contact pads 56 are deposited on the $n^+$ leads 48. These pads 56 may be expanded into interconnects.

Alternatively to the ion implantation, the lasers could be defined by the ion-beam etching step which produced the structure of FIG. 8. In this case, the uniformly thick ridge masks 40 would be replaced by 300 nm thick etch masks overlying the individual lasers. Also, thermal $Cl_2$ etching would passivate the etched columns.

Finally, if electrical connection to outside of the integrated circuit is required, bonding wires 58 are attached to the contact pads 56 and the column leads 54.

Although the invention has been described with reference to the fabrication of surface-emitting lasers, the invention is not so limited. Patterned tungsten used for both a mask for etching and as a mask for selective area regrowth can be applied to a wide variety of semiconductor devices, particularly where a sharp feature is formed in the semiconductor. It is particularly useful when the feature is deeply etched.

Although tungsten has been demonstrated as an effective selective-growth mask, the invention is not so limited. Other refractory metals, viz., V, Nb, Ta, Cr, and Mo, should demonstrate the same lack of catalysis of the chemically assisted deposition provided by W. For the mask material to be effective during the side etching, it should additionally be impervious to chlorine etching but be dissolved by fluorine etching.

Although in the described embodiments OMCVD has been used to selectively form the regrown regions, other forms of vapor-phase epitaxial growth (VPE) may be used, for example, chemical vapor deposition (CVD) and OMMBE. The deposition technique must rely at least partially upon a chemical reaction involving the different deposition components at the surface being deposited to form the components of the material being grown. Thus, in OMCVD growth of GaAs, trimethylgallium and arsine $((CH_3)_3As)$ react at the surface to provide the Ga and the As forming the crystalline GaAs. In OMMBE, the Ga is similarly provided by the surface reaction of the multi-species trimethylgallium while As is provided in elemental form by a molecular beam. The various forms of VPE generally rely upon vapor pressures in the growth chamber that are considerably higher than pressures used with MBE.

Additionally, liquid-phase epitaxy (LPE) can be used with the invention. Similarly to VPE, LPE is a chemically reactive epitaxial growth process involving at least one multi-species (non-elemental) precursor.

The invention allows a single tungsten mask to act as both the etching mask and as the selective regrowth mask. Because tungsten selectively prevents regrowth in chemical phase epitaxy, the relatively featureless regrowth can be quickly and economically performed.

What is claimed is:

1. A method for etching and regrowing a semiconductor, comprising the steps of:
   defining a mask comprising a refractory metal on a surface of a body comprising a first compound semiconductor;
   a first etching step of directionally etching said semiconductor through said mask to produce a structure in said body having a bottom surface and a side surface;
   a second etching step of etching said side surface by a chlorine etching process after said first etching step; and
   then growing a second compound semiconductor on said bottom surface and said side surface by a growth process in which at least one non-elemental precursor chemically reacts.

2. A method as recited in claim 1, wherein said refractory metal comprises tungsten.

3. A method as recited in claim 1, wherein said growth process comprises vapor phase deposition.

4. A method as recited in claim 1, further comprising depositing a vertical optical cavity structure comprising a plurality of compound semiconductor layers on a compound semiconductor substrate to thereby form said body, and wherein said defining step defines an array of a plurality of said masks, whereby said first etching step forms an array of optical cavities.

5. A method as recited in claim 4, wherein said depositing step deposits an active layer in a middle portion of said vertical-cavity optical structure, whereby said defining step defines an array of surface-emitting lasers.

6. A method as recited in claim 5, wherein said active layer comprises at least one quantum-well layer.

7. A method as recited in claim 5, wherein said growing step substantially planarizes said array of lasers.

8. A method as recited in claim 5, wherein said growing step deposits an insulating compound semiconductor horizontally adjacent to said active layer.

9. A method as recited in claim 8, wherein said growing step additionally deposits a conductive compound semiconductor horizontally adjacent to a portion of said vertical optical cavity structure disposed vertically away from said active layer.

10. A method as recited in claim 1, wherein said second etching step comprises a thermal chlorine etching.

11. A method as recited in claim 10, wherein said first etching step comprises ion beam etching in a chlorine ambient.

12. A method of forming an optical vertical-cavity structure, comprising the steps of:
   epitaxially depositing upon a substrate a vertical-cavity structure comprising a lower mirror, a spacer region, and at least part of an upper mirror;
   forming on said structure an array of masks comprising a refractory metal;
   a first step of directionally etching said structure through at least a portion of said upper mirror using said masks to protect portions of said structure from said etching, thereby forming an array of vertical cavities;
   a second step of etching with chlorine performed after said first etching step; and
   growing material on sides of said vertical cavities by vapor phase deposition wherein said material does not substantially grow on said masks.

13. A method as recited in claim 12, wherein said vertical-cavity structure includes an active region and wherein said first etching step etches through said active region.

14. A method as recited in claim 13, wherein said growing step grows an insulating material in a space removed by said first etching step.

15. A method as recited in claim 12, wherein said forming step forms and said depositing step deposits III-V semiconductor materials.

16. A method as recited in claim 12, wherein said second etching step comprises a thermal chlorine etching.

17. A method as recited in claim 16, wherein said first etching step comprises ion beam etching in a chlorine ambient.

18. A method for etching and regrowing a semiconductor, comprising the steps of:
   defining a mask on a surface of a body comprising a first semiconductor;
   a first etching step of anisotropically etching said semiconductor through said mask to produce a structure in said body having a bottom surface and a side surface;
   a second etching step of etching said side surface by a chlorine etching process after said first etching step; and
   then growing a second semiconductor on said bottom surface and said side surface.

19. A method as recited in claim 18, wherein said first etching step comprises ion beam etching.

20. A method as recited in claim 18, wherein said first and second semiconductors comprise compound semiconductors, wherein said mask comprises a refractory metal, and wherein said growing step grows said second semiconductor on said bottom surface and said side surface by growth process in which at least one non-elemental precursor chemically reacts.

* * * * *

UNITED STATES PATENT AND TRADEMARK OFFICE
CERTIFICATE OF CORRECTION

PATENT NO. : 5,104,824

DATED : April 14, 1992

INVENTOR(S) : Edward M. Clausen, Jr., Etienne G. Colas, Ann C. Von Lehmen

It is certified that error appears in the above-identified patent and that said Letters Patent is hereby corrected as shown below:

In the Abstract, line 11, "from" should read --form--; line 22, "ot" should read --to--.
Column 2, lines 2 and 3, "andoptical" should read --and optical--;
     line 26, "opening" should read --openings--.
Column 4, line 9, "lowerst" should read --lowest--.
Column 6, line 10, "implanation" should read --implantation--.

Signed and Sealed this

Twenty-second Day of June, 1993

Attest:

MICHAEL K. KIRK

Attesting Officer     Acting Commissioner of Patents and Trademarks